US008183082B1

(12) United States Patent
Lewis et al.

(10) Patent No.: US 8,183,082 B1
(45) Date of Patent: May 22, 2012

(54) FABRICATION OF ORGANIC SOLAR ARRAY FOR APPLICATIONS IN MICROELECTROMECHANICAL SYSTEMS AND OTHERS

(75) Inventors: Jason Lewis, Lutz, FL (US); Jian Zhang, Tampa, FL (US); Xiaomei Jiang, Tampa, FL (US)

(73) Assignee: University of South Florida, Tampa, FL (US)

( * ) Notice: Subject to any disclaimer, the term of this patent is extended or adjusted under 35 U.S.C. 154(b) by 262 days.

(21) Appl. No.: 12/630,398

(22) Filed: Dec. 3, 2009

Related U.S. Application Data

(60) Provisional application No. 61/119,572, filed on Dec. 3, 2008.

(51) Int. Cl.
*H01L 21/00* (2006.01)
(52) U.S. Cl. ............ 438/73; 438/99; 438/679; 438/722; 438/944; 136/263
(58) Field of Classification Search .................... 438/57, 438/608, 609, 73, 99, 679, 722, 944; 136/258, 136/263
See application file for complete search history.

(56) References Cited

U.S. PATENT DOCUMENTS
2006/0292736 A1* 12/2006 Lee et al. ........................ 438/73

OTHER PUBLICATIONS

Niggemann, et al., Realization of Ultrahigh Photovoltages With Organic Photovoltaic Nanomodules, Advanced Materials, 2008, vol. 20, pp. 4055-4060.
Lim, et al., High Voltage Polymer Solar Cell Patterned With Photolithography, Journal of Materials Chemistry, 2009, vol. 19, pp. 5394-5397.

* cited by examiner

*Primary Examiner* — Mary Wilczewski
*Assistant Examiner* — Toniae Thomas
(74) *Attorney, Agent, or Firm* — Jeremy Spier; Anton J. Hopen; Smith & Hopen, P.A.

(57) ABSTRACT

A method of fabricating organic solar arrays for application in DC power supplies for electrostatic microelectromechanical systems (MEMS) devices. A solar array with 20 miniature cells (as small as 1 mm$^2$) interconnected in series is fabricated and characterized. Photolithography is used to isolate individual cells and output contacts of the array, whereas the thermal-vacuum deposition is employed to make the series connections of the array. With 1 mm$^2$ for single cell and a total device area of 2.2 cm$^2$, the organic solar array based on bulk heterojunction structure of $\pi$-conjugated polymers and C60 derivative (6,6)-phenyl C61 butyric acid methyl ester produces an open-circuit voltage of 7.8 V and a short-circuit current of 55 $\mu$A under simulated air mass (AM) 1.5 illumination with an intensity of 132 mW/cm$^2$. The present method can be used in the fabrication of microarrays as small as 0.01 mm$^2$. This technology can be used to fabricate a power source that is light-weight and environmentally friendly for small electronic devices, with flexibility and cost-effectiveness.

13 Claims, 8 Drawing Sheets

| Array name | Active layer thickness (nm) | Number of cells in series | $V_{oc}$ (V) | $I_{sc}$ (mA) | $J_{sc}$ (mA/cm$^2$) | FF | $\eta$ (%) |
|---|---|---|---|---|---|---|---|
| Array 1 | 203 | 9 | 5.2 | 0.0545 | 0.605 | 0.32 | 0.76 |
| Array 2 | 202 | 15 | 7.0 | 0.0245 | 0.163 | 0.17 | 0.15 |
| Array 3 | 232 | 18 | 7.8 | 0.0135 | 0.075 | 0.13 | 0.06 |

Figure 5

FABRICATION OF ORGANIC SOLAR ARRAY FOR APPLICATIONS IN MICROELECTROMECHANICAL SYSTEMS AND OTHERS

CROSS REFERENCE TO RELATED APPLICATION

This application claims priority to U.S. Provisional Patent Application No. 61/119,572 by the same inventors, entitled "FABRICATION OF ORGANIC SOLAR ARRAY FOR APPLICATIONS IN MICROELECTROMECHANICAL SYSTEMS AND OTHERS" filed Dec. 3, 2008.

STATEMENT OF GOVERNMENT INTEREST

This invention was made with Government support under Grant No. W81XWH-07-1-0708 awarded by U.S. Army Medical Research and Materiel Command. The Government has certain rights in the invention.

FIELD OF INVENTION

This invention relates to organic solar arrays. More specifically, the fabrication of organic solar arrays for application in DC power supplies for electrostatic microelectromechanical systems devices.

SUMMARY OF INVENTION

The claimed invention provides for the usage of solar cells as power sources for applications where the main concern is output voltage rather than current, e.g., a power source for a electrostatic microelectromechanical systems (MEMS) device. The minuature size (as small as 0.1 mm^2) of the solar array of the claimed invention is ideal for powering MEMS devices and allows for easy integration with on-chip devices. For other functional applications, the minuature solar arrays can be fabricated on flexible substrates such as plastics, fabrics, and rubbers.

MEMS devices usually have their own requirements for power supplies. It is desirable to have an appropriate on-chip power source with a MEMS device, particularly in cases of autonomous operations such as wireless communication, sensor network, and microrobotic systems. Previous solutions for such power supplies include magnetic field-induced current and voltage supplies, electrothermal microactuators based on dielectric loss heating, rechargeable lithium microbatteries, integrated thermopile structures, vibration-electric energy conversion, and miniature fuel cells.

Solar cell is also an option for such power sources because it is self-contained and can be easily integrated with existing circuits of MEMS. Moreover, solar cell has the potential of achieving the maximum size to power density ratio compared with other miniature power sources. There have been previous studies about on-chip solar cell arrays for applications in MEMS devices, and the majority of these works are related to the silicon photovoltaic cells.

Organic solar cells (OSC) based on π-conjugated polymers (e.g., poly-3-hexylthiophene (P3HT)) and fullerene derivatives (e.g., (6,6)-phenyl C61 butyric acid methyl ester (PCBM)) have attracted attention over the past decades because they may provide a cost-effective route to wide use of solar energy for electrical power generation. These organic semiconductors have the advantage of being chemically flexible for material modifications, as well as mechanically flexible for the prospective of low-cost, large scale processing such as solution-cast on flexible substrates. The world's next generation of microelectronics are expected be dominated by "plastic electronics" and organic solar cells will play an important role in these future technologies.

The photovoltaic process in OSC devices consists of four successive processes: light absorption, exciton dissociation, charge transport, and charge collection. Absorption of a photon creates an exciton (bounded electron-hole pair). The exciton diffusion to a region (for instance, the interface of two different components) where exciton dissociation (or charge separation) occurs. Finally, free charges move separately toward the anode (holes) and cathode (electrons), where they are collected. Several parameters determine the performance of a solar cell, namely, the open-circuit voltage (Voc), short-circuit current (Isc), and the so-called fill factor (FF). FF is calculated by $$FF = \frac{I_{mp}V_{mp}}{I_{SC}V_{oc}}, \quad (1)$$

where $I_{mp}$ and $V_{mp}$ are the current and voltage operating points for maximum power, respectively. The overall power conversion efficiency η is defined as $$\eta = \frac{I_{mp}V_{mp}}{P_{in}} = \frac{FF * I_{sc}V_{oc}}{P_{in}}. \quad (2)$$

Although the current power conversion efficiency (about 6%) of OSC is still not high enough to make it a practical solution for large-scale commercial applications as general electric power sources, it is promising to use OSC as a high-voltage power supply. The open-circuit voltage of single junction OSC (Voc=0.6-0.7 eV) is close to that of the single crystal Si or thin film polycrystalline Si. For many electrostatic MEMS, it is more critical to have high-voltage output (from tens to hundreds of volts) rather than high current or energy efficiency, with an operating current range usually between nanoamperes and microamperes. According to the design criteria of such on-chip solar cells, OSC based on π-conjugated polymers and fullerene derivatives is an excellent choice. First of all, isolation of the solar cell array from the MEMS substrate is easy to achieve, since OSC can be fabricated on any substrate including plastic. This also makes the integration with microsensors and microactuators relatively effortless. Second, these polymers are efficient light absorbers (with a typical absorption coefficient several orders higher than that of the conventional semiconductors such as Si) meaning the active layer can be as thin as 100 nm, which makes it simple for series interconnection to produce high voltage. Third, Voc of a single cell of these OSCs can be easily tuned as high as 0.87 V by chemical tailoring of both constituents. Fourth, the photoactive layer can be made through any solution processable fabrication methods (i.e., spin-coating, spraying, and inkjet printing) without the need of photolithography, which is mandatory with silicon-related fabrication process. These OSC can be manufactured on plastic substrates, making these cells lightweight, flexible, and very cost-effective. The usual drawbacks of OSC (e.g., lower short-circuit current and power conversion efficiency) are not the major issues for using them as on-chip DC power sources, making OSC a perfect solution for MEMS inertia transducers, such as resonators, accelerometers, gyroscopes, and pressure sensors.

The present invention is a small (2.2 cm²) photovoltaic minimodule having 20 cells in series. The anode is made by patterning indium tin oxide (ITO) on glass by photolithography. The cathode is made by thermal evaporation through a metal shadow mask, which simultaneously accomplishes the series connection of all cells. The active layer material used in present method is a blend of P3HT and PCBM, which forms a bulk heterojunction structure. The present invention provides a method of fabricating an array and the characterization of both single cell and interconnected solar array. Also provided are the factors that affect the output voltage and overall power efficiency, as well as several solutions for short-circuit problems within the array. The method of the present invention provides for full isolation of series connected cells, and this method can be used in the fabrication of microarrays as small as 0.01 mm².

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Figure 1A:
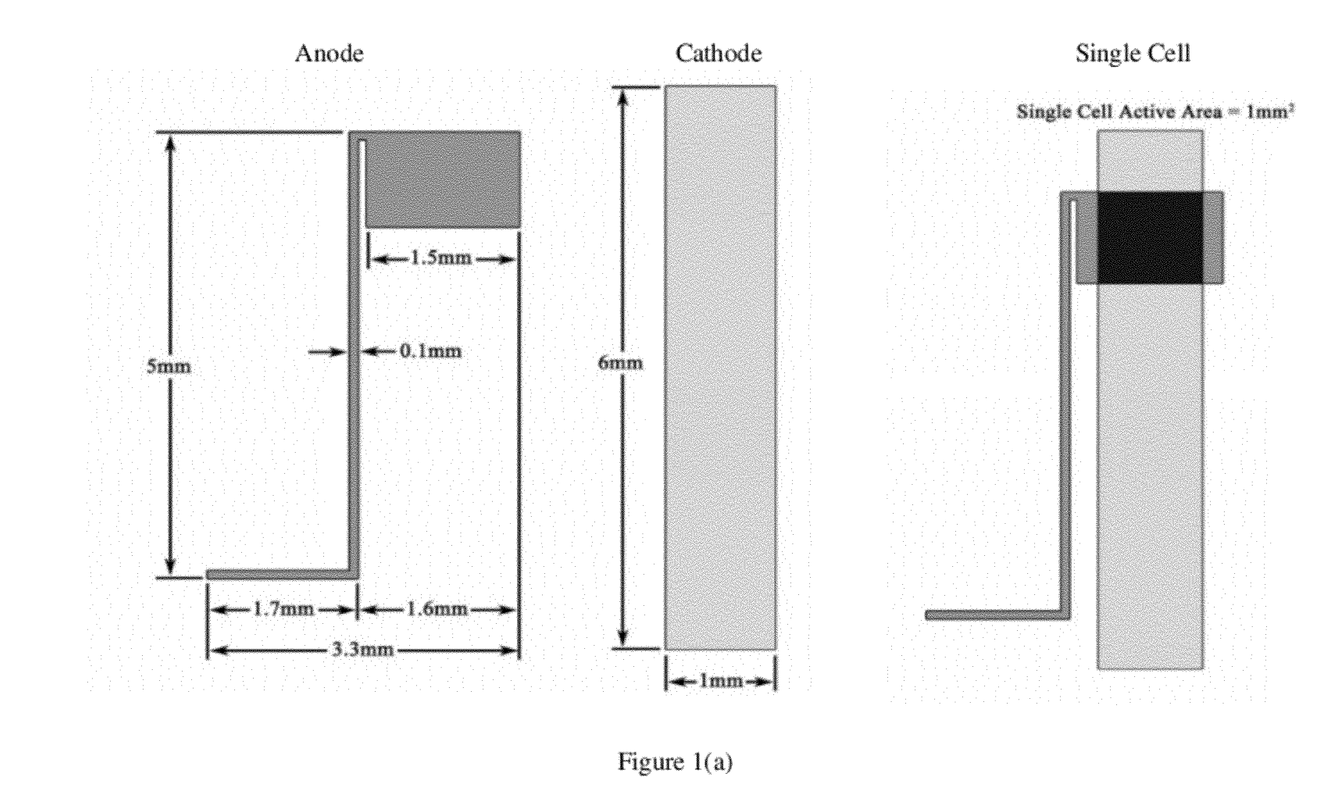
FIG. 1(a) is an enlarged diagram of the anode, cathode, and sandwich structure of a single cell with area of 1 mm².
Figure 1B:
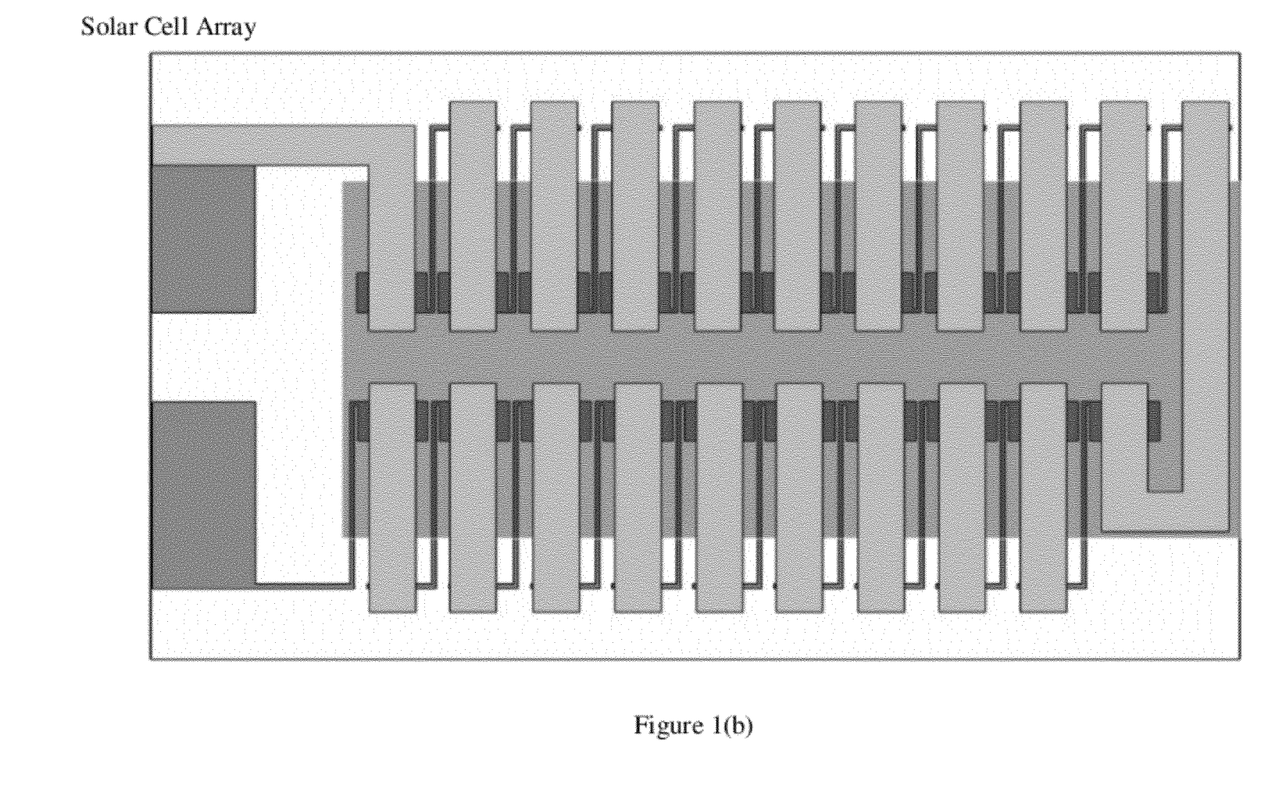
FIG. 1(b) is an illustration of the interdigitated organic solar cell array.

The first step was the design of the solar array. The ability to align the substrate with the shadow mask by eye in the inert environment as well as other process parameters were considered before a final geometric design was made for the array. FIG. 1(b) shows such an array consisting of 20 single cells. FIG. 1(a) shows the geometry of each cell.

In an embodiment, the whole fabrication process consists of four steps:

1. Patterning of the Anode

ITO coated glass substrates (>85% transmittance, 5-15Ω/□) are cut into 1 in.×1 in. pieces. The patterning of ITO is done via standard photolithography using a custom made photomask, as shown in FIG. 1. The photomask is made by printing the desired pattern on one plastic transparency and taped onto a piece of 5 in.×5 in. glass. Positive photoresist (Shipley 1813) is spun-coat onto the ITO side of the substrate at a rate of 4500 rpm for 45 seconds, creating a layer with thickness of about 1.5 μm. The substrate is then soft baked on a 90° C. hotplate for 90 seconds, followed by a 3-second exposure to ultraviolet light through the photomask. The substrate is then developed in Shipley MF319 for about 1 minute, followed by a hard bake at 150° C. for 10 minutes. Etching of the ITO is done in a mixed solution of HCl and $HNO_3$. The patterned ITO substrate then undergoes sonification cleaning in trichloroethylene, acetone, and isopropanol at 50° C. for 20 minutes each, followed by drying with $N_2$. The glass substrate now has the desired pattern of ITO, which acts as the anode part of the solar array.

2. Creation of the Shadow Mask

A 1 in.×1 in. piece of stainless steel is patterned following a similar photolithography procedure described above. Etching of the photoresist coated stainless steel is done using a diluted ferric chloride ($FeCl_3$) solution (25% in deionized (DI) water) for 2 hours. The patterned shadow mask, as shown in FIG. 1, is rinsed by DI water and sonification in acetone and isopropanol at 50° C. for 20 minutes.

3. Formation of the Photoactive Layer

The original aqueous poly(3,4ethylenedioxythiophene):poly(styrenesulfonat) (PEDOT:PSS) (Baytron 500) is diluted and filtered three times, then filtered out through a 0.45 μm filter. The solution is spun coat on top of the patterned ITO at a rate of 5000 rpm for 90 seconds after which the substrate is heated up to 120° C. for 100 minutes. The active layer solution is made by mixing P3HT and PCBM with a weight ratio of 1:1 in chloroform, then spun-coat on top of the PEDOT:PSS coated substrate at a rate of 700-800 rpm for 90 seconds. This provides a thickness of 200 nm. The excess film is wiped off in order to allow the aluminum to make the series connections required, as shown in FIG. 1. The sample is allowed to dry for a minimum of 3 hours in vacuum before thermal evaporation of the cathode.

4. Deposition of the Cathode

In order for the device to function as a series array, the patterned shadow mask must be precisely aligned to the ITO substrate (see FIG. 1). With the alignment done, the substrate is fixed onto the chuck and loaded into the deposition chamber. Aluminum was chosen for the cathode due to its desirable work function (for collection of electrons) and cost-effectiveness. Deposition of aluminum is done under high vacuum ($>10^{-7}$ torr), with a final thickness of 100 nm Device fabrication is completed with a final annealing on a hotplate at 110° C. for 5 minutes in a glove box, prior to I-V measurements.

Figure 2:
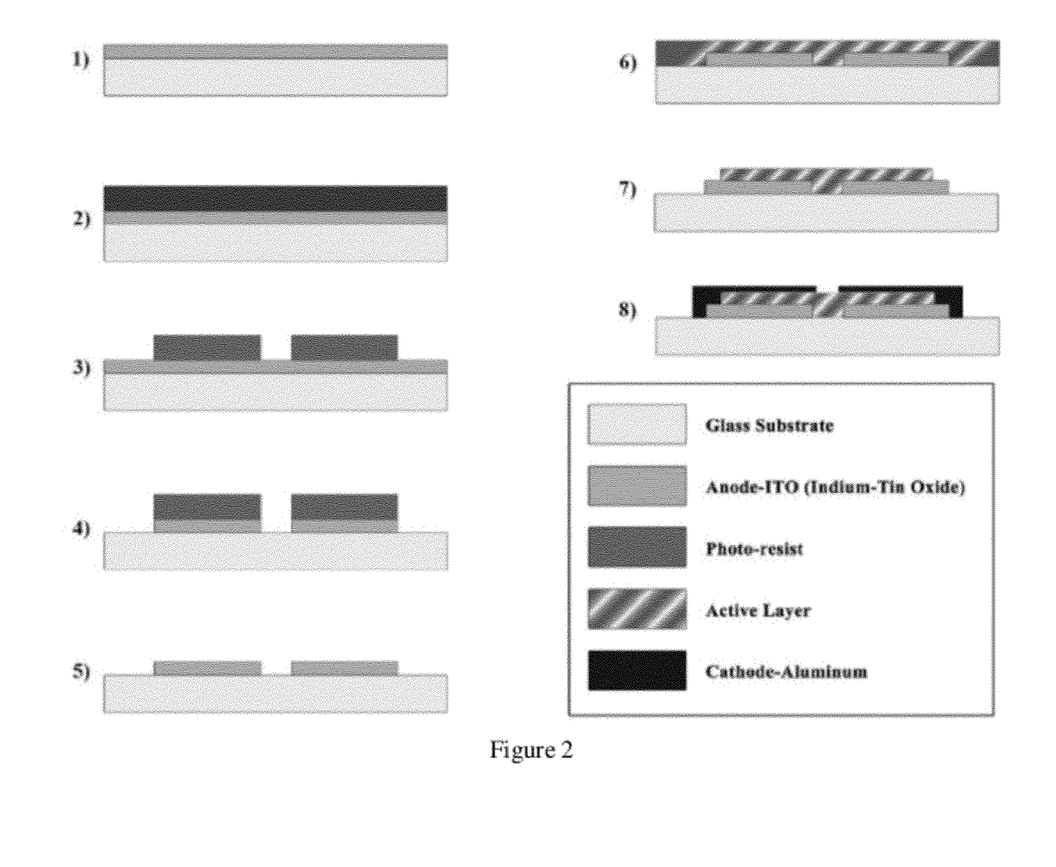
FIG. 2 is a flowchart of the fabrication process of miniature solar cell array.

FIG. 2 illustrates the fabrication process for the organic solar array. The active layer is spun-coat from a chloroform solution of P3HT:PCBM blend with a weight ratio of 1:1.

Figure 3A:
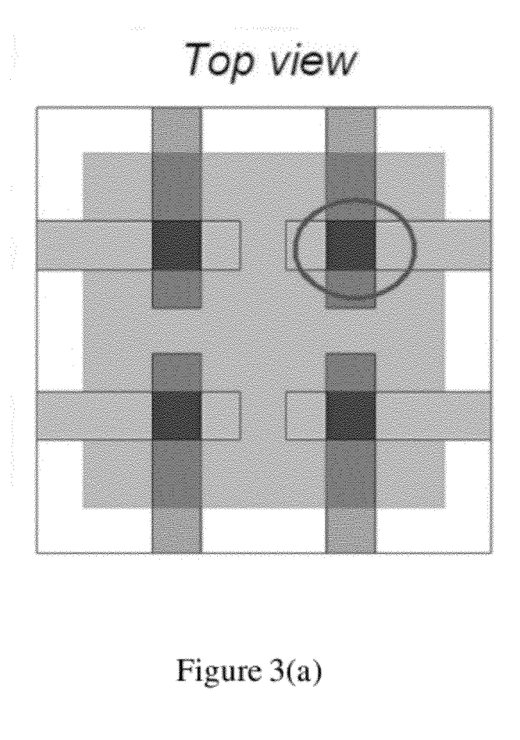
FIG. 3(a) is a top view of a single organic solar cell with bulk hetero-junction structure.
Figure 3B:
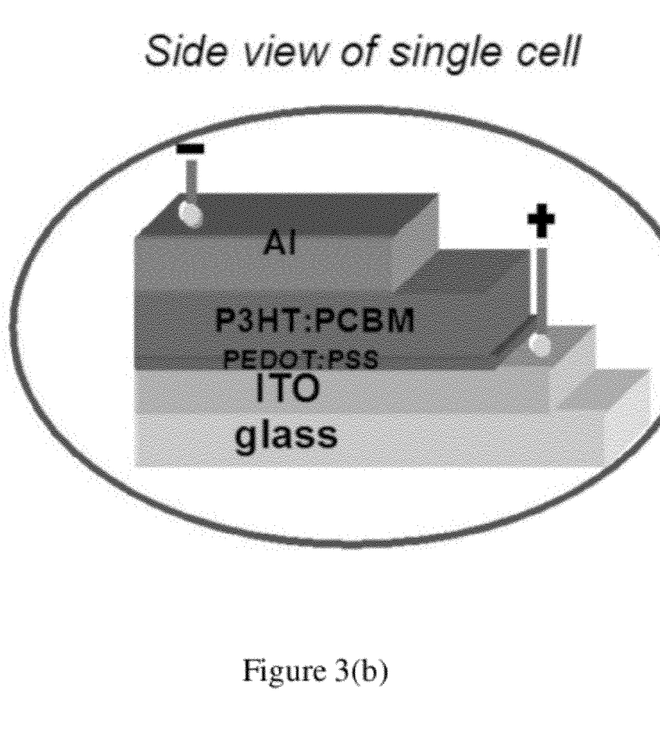
FIG. 3(b) is a side view of a single organic solar cell with bulk hetero-junction structure.

In order to examine the solar array fabrication procedure described above and find the operational parameters for various processes, test OSC was fabricated in a simpler geometry consisting of four single cells, each having an active area of 4 mm², as shown in FIG. 3(a). FIG. 3(b) shows the side view of each cell in bulk heterojunction structure. Preliminary optimization was performed in terms of spin rate and thermal annealing conditions. The best performed single cell was fabricated with an active layer thickness of 200 nm followed by a post-device thermal annealing at 120° C. for 5 minutes.

Figure 3C:
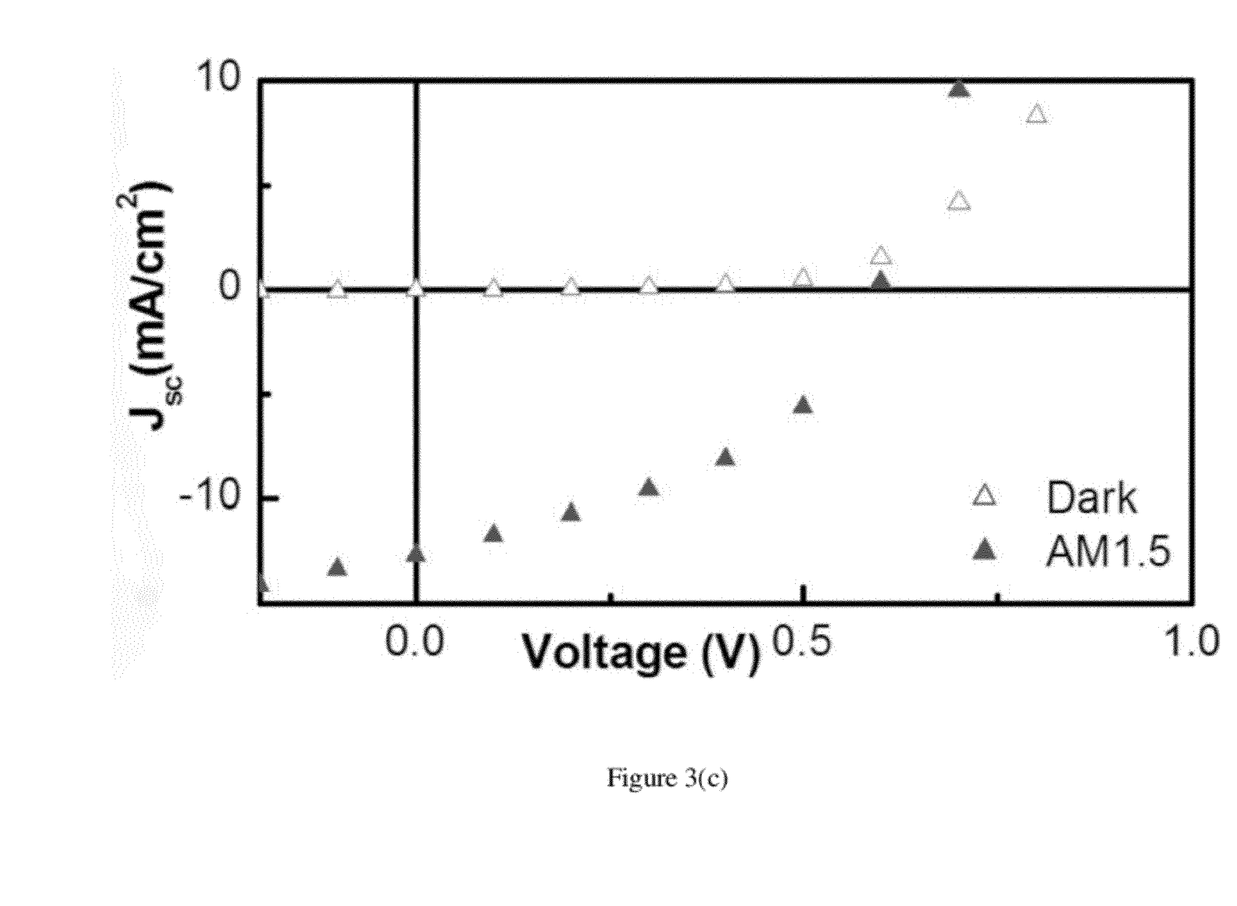
FIG. 3(c) is a graph showing the current-voltage characteristics of single cell made with P3HT:PCBM mixed with weight ratio of 1:1 under simulated AM1.5G, radiation at 132.6 mW/cm².

The current-voltage (I-V) characterization of the solar cells was performed on a solar simulator consisting of a xenon arc lamp (Oriel 66485) and an air mass (AM) 1.5 global filter (Oriel 81094) with irradiation of 132.6 mW/cm². No spectral mismatch with the standard solar spectrum AM 1.5 (with an intensity of 100 mW/cm$^2$) was corrected in the I-V characterization. The best of such single devices has a short-circuit current density $J_{sc}$=12.7 mA/cm$^2$, open-circuit voltage $V_{oc}$=0.60 V, FF=0.43, and a power conversion efficiency of 2.45%, as shown in FIG. 3(c). This modest efficiency can be improved by nanomorphology manipulations; the main purpose herein is to find the right parameters for each fabrication process.

Figure 4A:
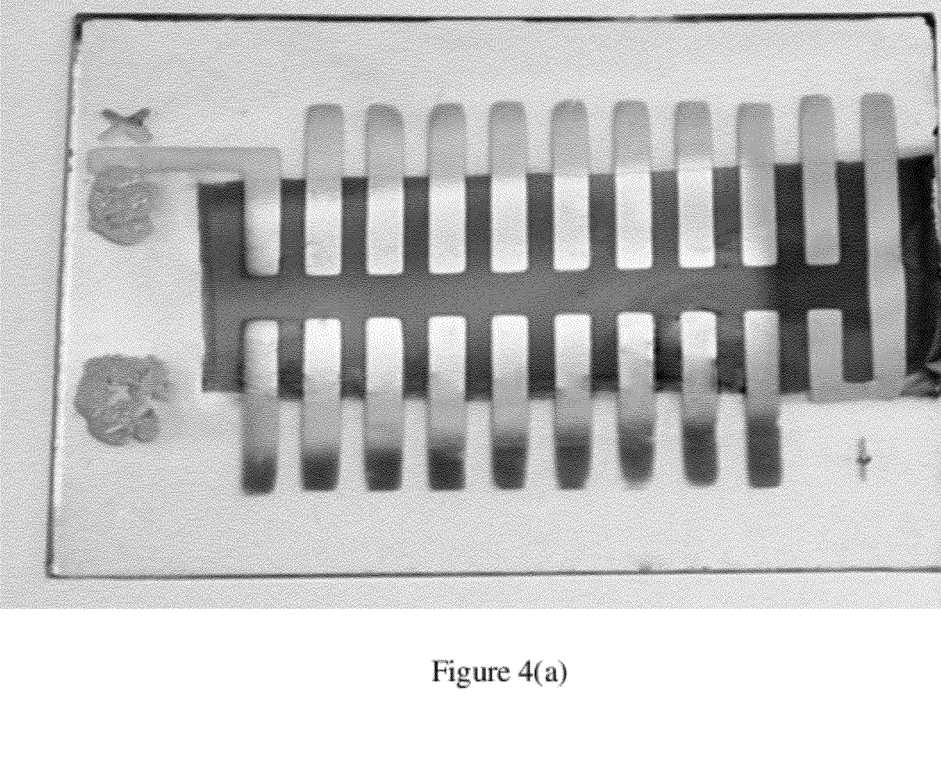
FIG. 4(a) is an illustration of the organic solar array with 20 miniature cells in series.
Figure 4B:
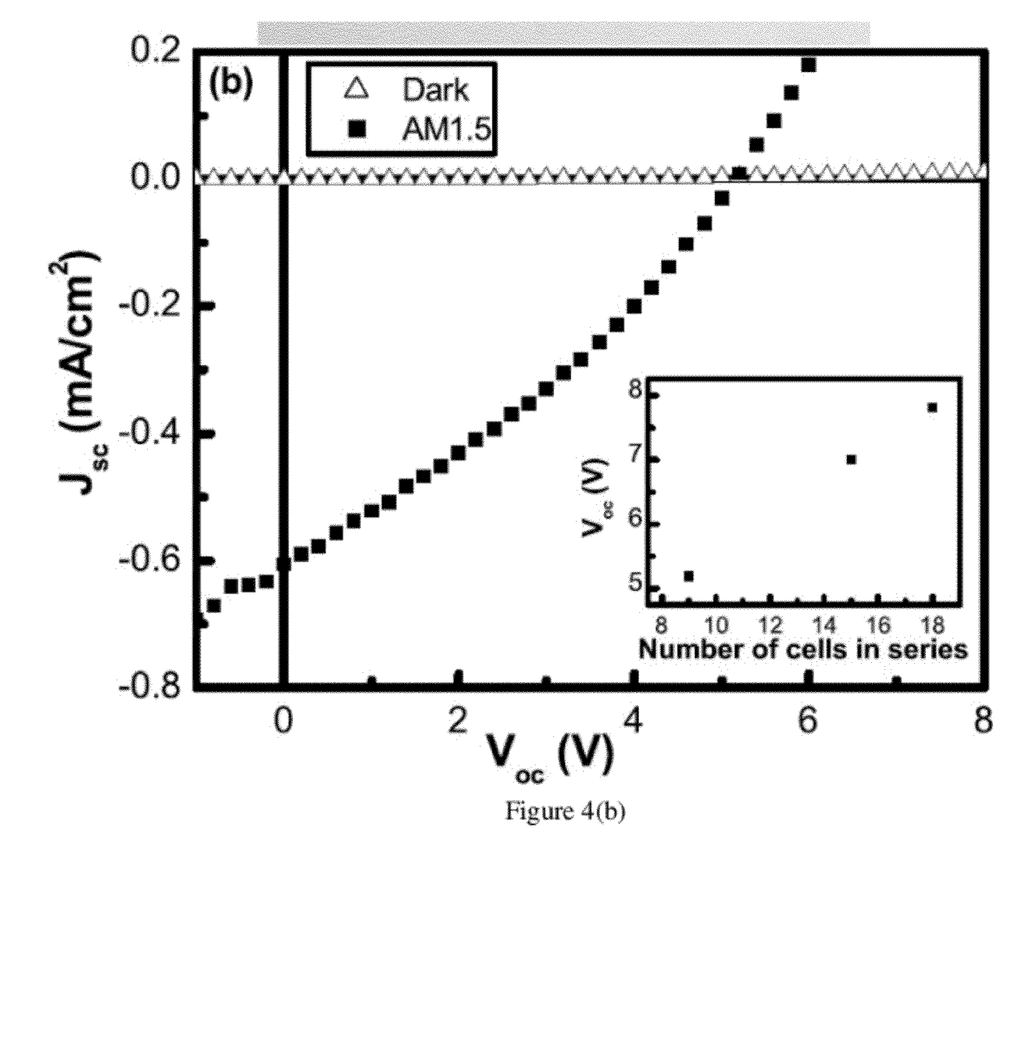
FIG. 4(b) is a graph showing the current-voltage curve of an organic solar array with nine functioning cells measured at simulated AM1.5G with radiation of 132.6 mW/cm².

Using these appropriate parameters, organic solar cell array based on the same photoactive material (P3HT and PCBM blend) used above was fabricated according to the fabrication procedure above. The interconnected series consists of 20 cells each with active area of 1 mm$^2$ on a 1 in$^2$ ITO substrate. A picture of such an array is shown in FIG. 4(a). FIG. 4(b) shows the I-V curve of the best performed array (array 1 in FIG. 5). Though extra caution and efforts have been made to avoid short circuits among individual cells, the alignment of shadow mask with the ITO anodes inside the glove box turned out to be very challenging, especially when the active layer is thin (<200 nm). Not-so-perfect alignment resulted in "shadow effect," which smeared out the contact to neighboring cells, causing unintentional lateral connection.

Figure 5:
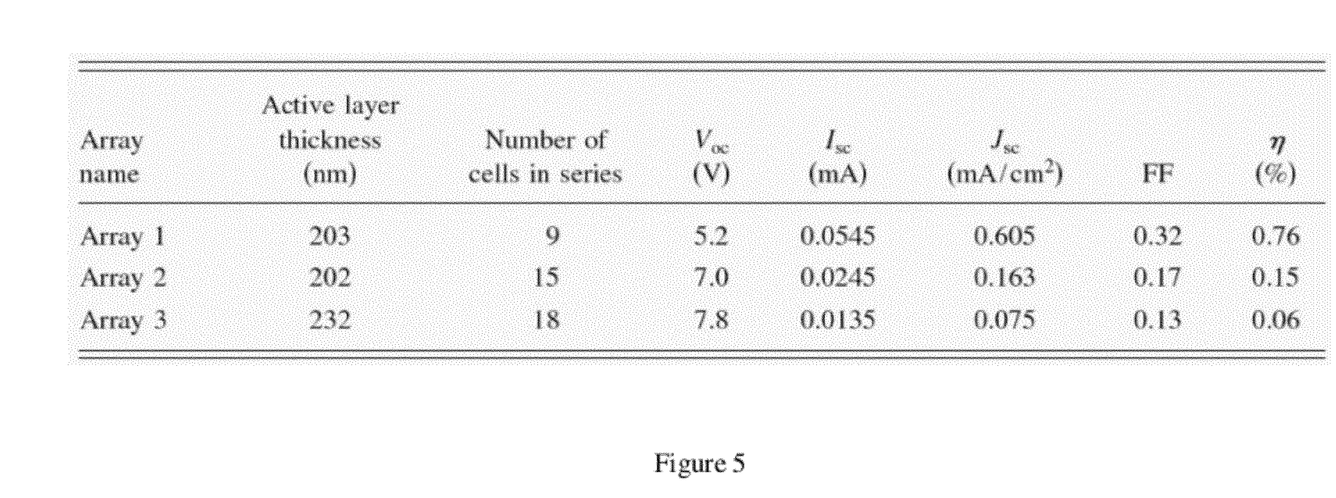
FIG. 5 is a table summarizing the device parameters for three organic solar cell arrays containing different numbers of cells in series.

The active layer thickness was increased to see how it would help with short circuits of individual cells. FIG. 5 gives a summary of three solar arrays with different active layer thicknesses. It can be seen that, with thicker film, a smaller number of cells was short circuited. The inset of FIG. 4(b) plots the array $V_{oc}$ versus the number of cells in series, and a linear relation is shown; for a total of 18 minicells, the measured $V_{oc}$ is 7.8 V.

A device was fabricated that has the capability to obtain larger $V_{oc}$ in terms of the application for DC power supply. The results demonstrate the potential to easily tune the output voltage by the number of cells in series. Further improvement of the array performance is ongoing to determine the optimization of active layer thickness and nanomorphology, as well as to reduce $R_s$ of the array device by means of thermal annealing and modifying the contact properties between active layer and the electrodes.

In conclusion, a miniature organic solar array was designed, fabricated, and characterized for application in MEMS device power supplies. The photoactive layer is formed by spin coating a thin film of π-conjugated polymer P3HT and fullerene derivative PCBM blend mixed in chloroform. The electrodes are patterned by photolithography and thermal evaporation through a patterned shadow mask. An output voltage of 7.8 V and short-circuit current as large as 55 μA under simulated solar AM1.5 illumination is achieved with the small array device (2.2 cm$^2$).

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of fabricating a miniature organic solar array, comprising the steps of:
    patterning indium tin oxide onto a glass substrate;
    spin coating positive photoresist onto said glass substrate;
    soft baking said glass substrate;
    exposing said photoresist to a pattern of UV light using a mask and mask aligner, said mask making contact with said photoresist which is used as a stencil for said UV light;
    hard baking said glass substrate
    developing said glass substrate;
    etching said indium tin oxide in a mixed solution of HCL and HNO$_3$;
    cleaning said glass substrate;
    placing said glass substrate in an inert environment;
    spin coating PEDOT:PSS onto said glass substrate;
    spin coating an active layer of P3HT:PCBM;
    removing excess P3HT:PCBM;
    drying said glass substrate;
    using a shadow mask to deposit an Aluminum cathode by Thermal Vapor Deposition, said shadow mask being aligned with said glass substrate and acting as a stencil during deposition;
    heating said aluminum with current and in vacuum; and
    annealing said solar array.

2. The method of claim 1, further comprising:
    said spin coating of positive photoresist onto said substrate being at 4500 rpm for 45 seconds.

3. The method of claim 1, further comprising:
    said soft baking of said glass substrate lasting for 180 seconds at 90 degrees Celsius.

4. The method of claim 1, further comprising:
    said hard bake lasting for 10 minutes at 135 degrees Celsius.

5. The method of claim 1, further comprising:
    said mixed solution of HCL and HNO$^3$ being 20% HCL and 7% HNO$^3$.

6. The method of claim 1, further comprising:
    said cleaning being sonification in trichloroethylene, acetone, and isopropanol at 50 degrees Celcius for 20 minutes.

7. The method of claim 1, further comprising:
    said inert environment being N$^2$.

8. The method of claim 1, further comprising:
    said spin coating of an active layer of P3HT:PCBM being at a rate of 700 rpm for 30 seconds.

9. The method of claim 1, further comprising:
    said drying lasting for a minimum of 3 hours.

10. The method of claim 1, further comprising:
    said shadow mask being stainless steel and fabricated using photolithography and a diluted etching solution.

11. The method of claim 10, further comprising:
    said diluted etching solution being FC$^{13}$.

12. The method of claim 1, further comprising:
    said current being 50 amperes and said vacuum being 10^−7 torr.

13. The method of claim 1, further comprising:
    said annealing lasting for 5 minutes at 110 degrees Celsius.

* * * * *